US009910108B2

(12) United States Patent
Ross

(10) Patent No.: US 9,910,108 B2
(45) Date of Patent: Mar. 6, 2018

(54) REAL-TIME MAGNETIC FIELD CAMERA

(71) Applicant: Daniel Clyde Ross, Mount Vernon, WA (US)

(72) Inventor: Daniel Clyde Ross, Mount Vernon, WA (US)

(73) Assignee: Daniel Clyde Ross, Mount Vernon, WA (US)

( * ) Notice: Subject to any disclaimer, the term of this patent is extended or adjusted under 35 U.S.C. 154(b) by 86 days.

(21) Appl. No.: 15/193,140

(22) Filed: Jun. 27, 2016

(65) Prior Publication Data

US 2017/0371009 A1    Dec. 28, 2017

(51) Int. Cl.
| | | |
|---|---|---|
| *G01R 33/10* | (2006.01) | |
| *G01R 33/00* | (2006.01) | |
| *G01R 33/07* | (2006.01) | |
| *G06T 11/00* | (2006.01) | |
| *G01R 33/09* | (2006.01) | |

(52) U.S. Cl.
CPC ......... *G01R 33/10* (2013.01); *G01R 33/0094* (2013.01); *G01R 33/07* (2013.01); *G01R 33/09* (2013.01); *G06T 11/001* (2013.01)

(58) Field of Classification Search
CPC ............ G01R 33/0023; G01R 33/0029; G01R 33/0047; G01R 33/0052; G01R 33/0094; G01R 33/02; G01R 33/06; G01R 33/09; G01R 33/10
USPC ...................... 324/247, 251, 224, 244.1, 246
See application file for complete search history.

(56) References Cited

U.S. PATENT DOCUMENTS

| | | | | |
|---|---|---|---|---|
| 6,242,911 B1* | 6/2001 | Maschek | ............ | G01R 29/0878 324/247 |
| 6,640,454 B2* | 11/2003 | Kato | ...................... | G01C 17/28 324/247 |
| 6,768,301 B1* | 7/2004 | Hohe | .................. | G01R 33/0094 324/225 |
| 7,302,345 B2* | 11/2007 | Kwon | .................... | G01R 33/10 33/355 R |
| 7,603,251 B1* | 10/2009 | Wiegert | ................. | G01V 3/081 702/152 |
| 8,552,721 B2* | 10/2013 | Peev | .................. | G01R 33/0005 324/207.2 |
| 8,786,278 B2* | 7/2014 | Ohta | .................... | G01R 33/093 324/247 |
| 2007/0108975 A1* | 5/2007 | Desplats | ................. | G01R 33/02 324/247 |
| 2010/0154088 A1* | 6/2010 | Sandhu | .................. | B82Y 35/00 850/46 |

(Continued)

FOREIGN PATENT DOCUMENTS

| | | | | | |
|---|---|---|---|---|---|
| CN | 105783919 A | * | 7/2016 | ............. | G01C 21/08 |
| EP | 2703831 A1 | * | 3/2014 | ......... | G01R 33/0094 |
| JP | 2016148673 A | * | 8/2016 | ......... | G01R 33/0094 |

*Primary Examiner* — John Villecco

(57) ABSTRACT

A Real-Time Magnetic Field Camera wherein magnetic fields are instantaneously converted into an electronic display as a motion picture on a screen. The Real-Time Magnetic Field Camera is extremely portable, outputs magnetic field data instantly giving the user the ability to passively locate and study magnetic phenomenon as they exist in the real world. The Real-Time Magnetic Field Camera invention includes; magnetic sensors that are triangulated, at least one microcontroller and/or microprocessor, has a power source and has a means of an image display.

9 Claims, 9 Drawing Sheets

(56) References Cited

U.S. PATENT DOCUMENTS

| | | | | |
|---|---|---|---|---|
| 2011/0065585 | A1* | 3/2011 | Lanting | G01R 33/0354 |
| | | | | 505/162 |
| 2012/0209546 | A1* | 8/2012 | Vervaeke | G01R 33/0064 |
| | | | | 702/57 |
| 2014/0021942 | A1* | 1/2014 | Kim | G01R 33/10 |
| | | | | 324/207.11 |
| 2015/0149103 | A1* | 5/2015 | Shimizu | G01R 33/06 |
| | | | | 702/65 |
| 2015/0276895 | A1* | 10/2015 | Vervaeke | G01R 33/0094 |
| | | | | 324/244.1 |
| 2015/0316394 | A1* | 11/2015 | Kim | G01D 5/145 |
| | | | | 324/207.2 |
| 2016/0131723 | A1* | 5/2016 | Nagasaka | G01R 33/26 |
| | | | | 324/244.1 |
| 2016/0259017 | A1* | 9/2016 | Iriguchi | G01R 33/0088 |
| 2016/0370441 | A1* | 12/2016 | Goodson | G01R 33/10 |
| 2017/0082769 | A1* | 3/2017 | Tsunasaki | G01V 3/10 |

* cited by examiner

FIG. 3
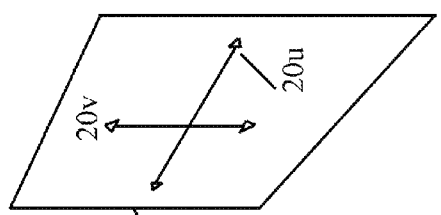
Principals of triangulation
17
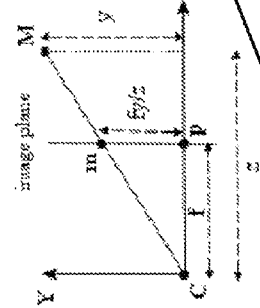
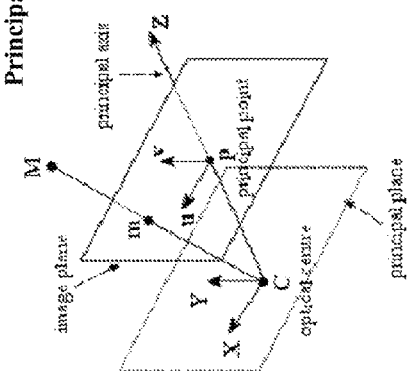
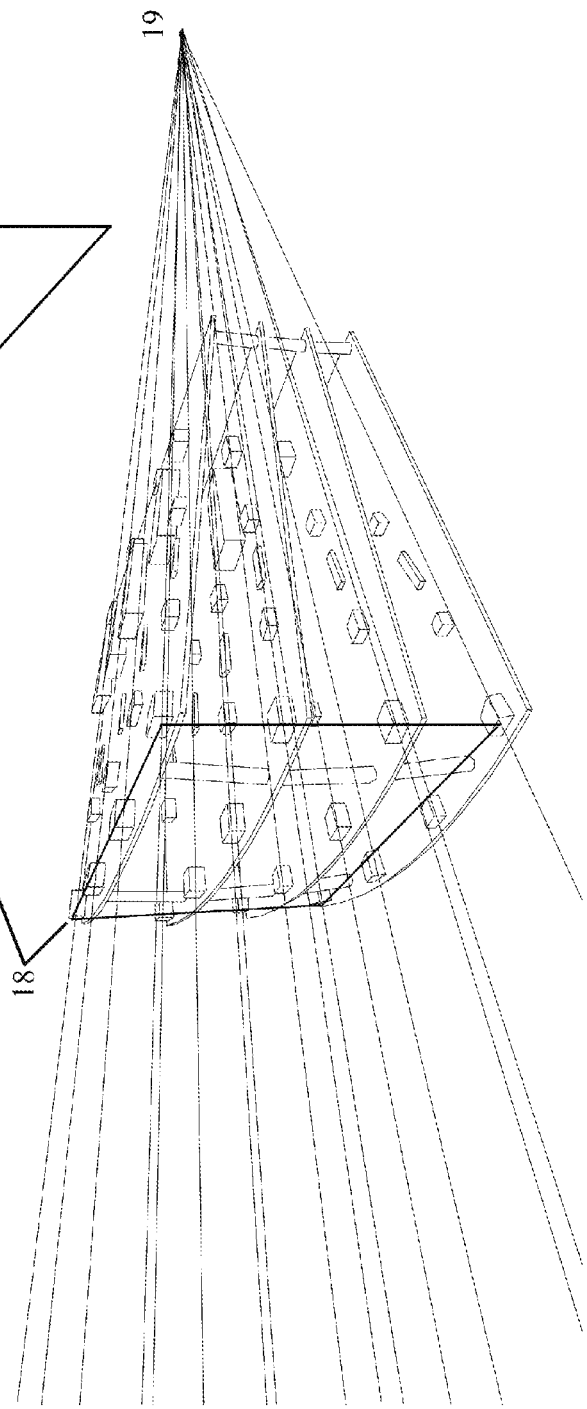

FIG 4
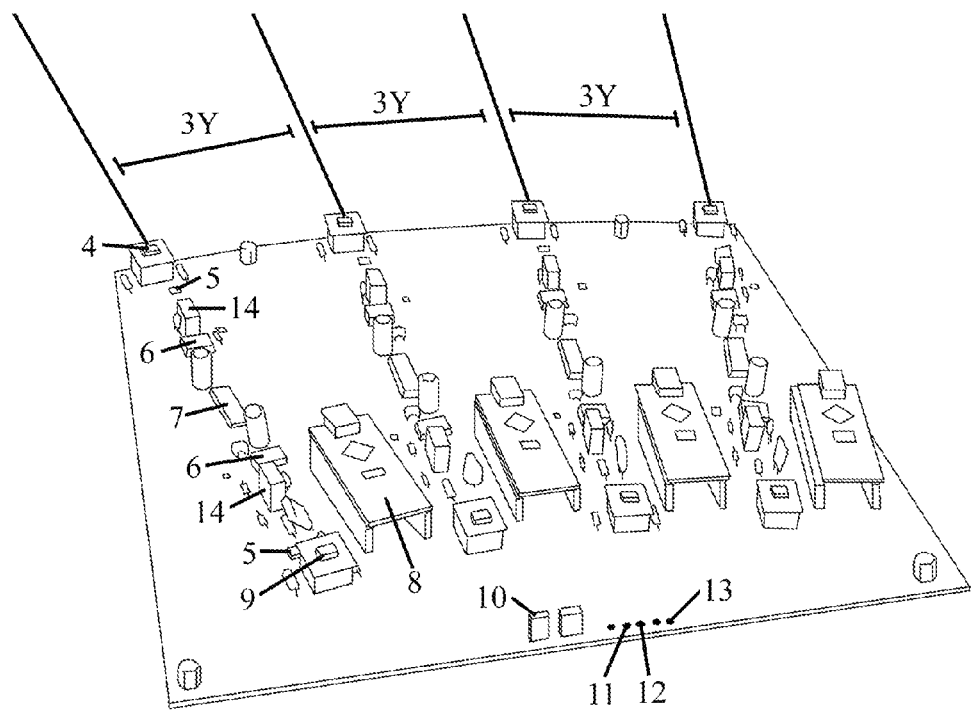
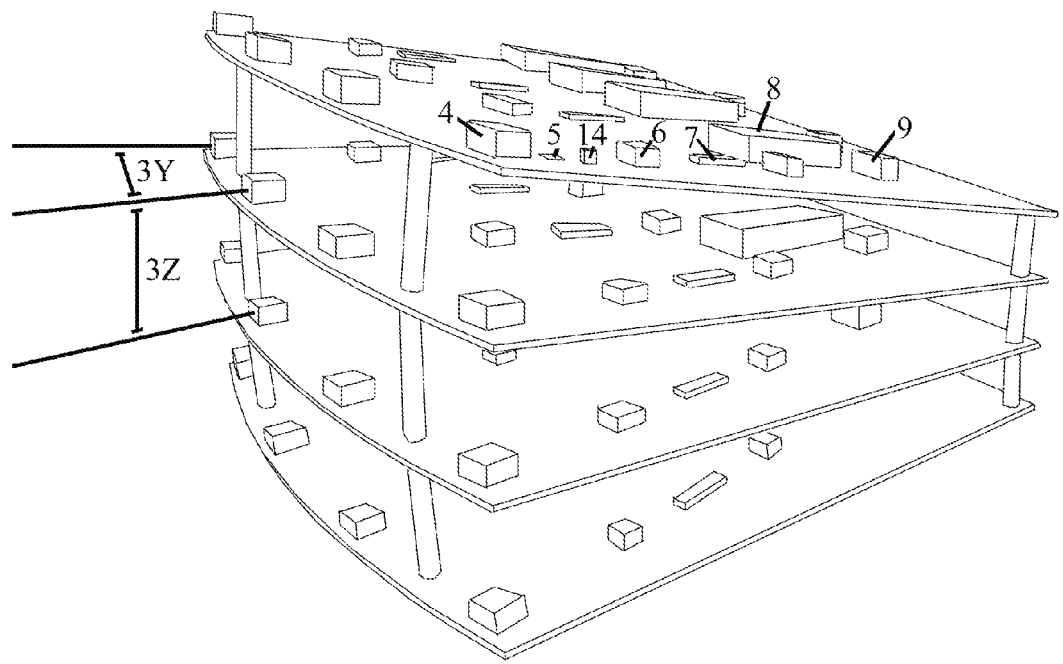

FIG. 6
Magnetic Sensor Schematic
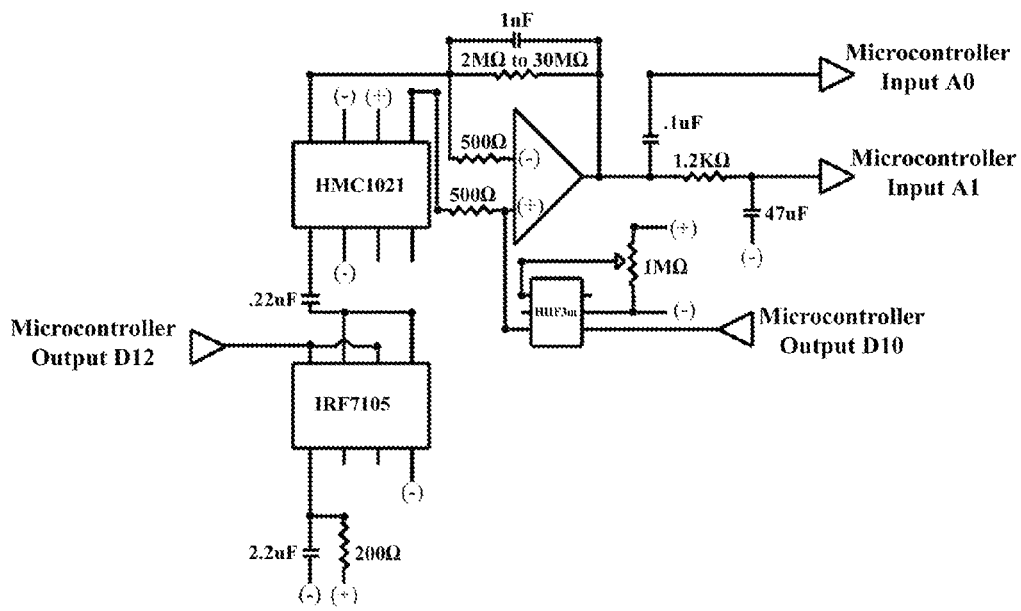
Arduino Nano Microcontroller
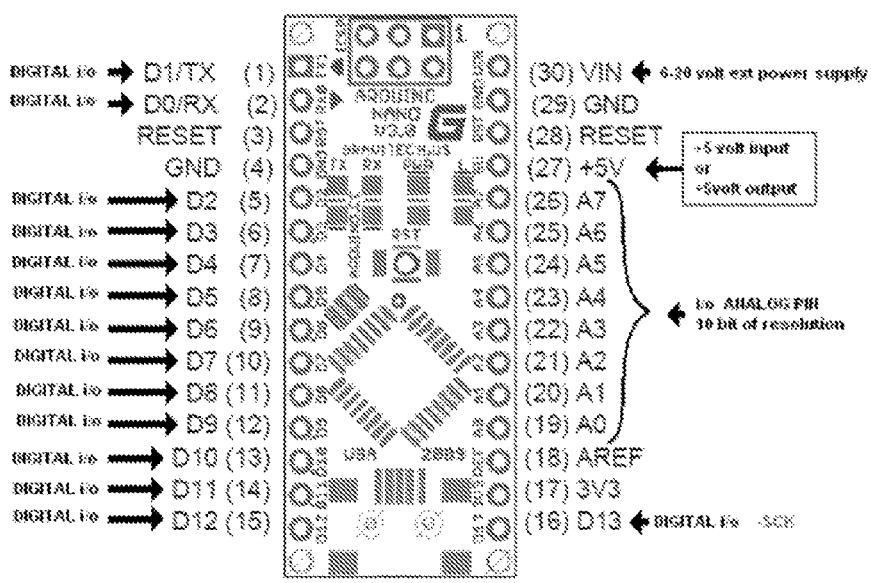

FIG. 8

| | | | | | |
|---|---|---|---|---|---|
| A1 | X1=(A1+A2)/2 | A2 | X2=(A2+A3)/2 | A3 | X3=(A3+A4)/2 | A4 |
| X4=(A1+A5)/2 | X5A=(A1+A6)/2<br>X5B=(A2+A5)/2<br>X5=(X5A+X5B)/2 | X6=(A2+A6)/2 | X7A=(A2+A7)/2<br>X7B=(A3+A6)/2<br>X7=(X7A+X7B)/2 | X8=(A3+A7)/2 | X9A=(A3+A8)/2<br>X9B=(A4+A7)/2<br>X9=(X9A+X9B)/2 | X10=(A4+A8)/2 |
| A5 | X11=(A5+A6)/2 | A6 | X12=(A6+A7)/2 | A7 | X13=(A7+A8)/2 | A8 |
| X14=(A5+A9)/2 | X15A=(A5+A10)/2<br>X15B=(A6+A9)/2<br>X15=(X15A+X15B)/2 | X16=(A6+A10)/2 | X17A=(A6+A11)/2<br>X17B=(A7+A10)/2<br>X17=(X17A+X17B)/2 | X18=(A7+A11)/2 | X19A=(A7+A12)/2<br>X19B=(A8+A11)/2<br>X19=(X19A+X19B)/2 | X20=(A8+A9)/2 |
| A9 | X21=(A9+A10)/2 | A10 | X22=(A10+A11)/2 | A11 | X23=(A11+A12)/2 | A12 |
| X24=(A9+A13)/2 | X25A=(A9+A14)/2<br>X25B=(A10+A13)/2<br>X25=(X25A+X25B)/2 | X26=(A10+A14)/2 | X27A=(A10+A15)/2<br>X27B=(A11+A14)/2<br>X27=(X27A+X27B)/2 | X28=(A11+A15)/2 | X29A=(A11+A16)/2<br>X29B=(A12+A15)/2<br>X29=(X29A+X29B)/2 | X30=(A12+A16)/2 |
| A13 | X31=(A13+A14)/2 | A14 | X32=(A14+A15)/2 | A15 | X33=(A15+A16)/2 | A16 |

REAL-TIME MAGNETIC FIELD CAMERA

RELATED APPLICATIONS

The present application is a continuation of provisional patent Ser. No. 62/191,591, filed Jul. 13, 2015.

FIELD OF THE INVENTION

The present invention relates to electronics and, especially, to passive magnetic field imaging.

BACKGROUND OF THE INVENTION

Magnetic fields do not produce any form of light therefore they are invisible. Other magnetic field imaging devices are impractical when it comes to portability. They take too long to produce an image, having no ability to capture fleeting magnetic phenomenon. The Real-Time Magnetic Field Camera is extremely portable and outputs magnetic field data instantly giving the user the ability to study magnetic phenomenon as they exist in the real world.

As stated above, magnetic fields do not produce any form of light therefore they are invisible. The invention claimed here solves this problem. This device uses electronics to convert magnetic fields into analog voltages, converted to digital inputs, then through programming, can be displayed on a screen. The claimed invention differs from, and is an improvement on, what currently exists.

Magnetic field imaging today is done with a plate that scans an object that is placed upon it. Another form of magnetic field imaging uses lasers and single point scanning magnetometers to create an image. It takes the lasers over 10 hours, and single point scanning magnetometers considerable time to develop one still image. The invention described herein is a portable and instantaneous method of magnetic field imaging. Other magnetic field imaging devices are impractical when it comes to portability. They take too long to produce an image, having no ability to capture fleeting magnetic phenomenon.

The Real-Time Magnetic Field Camera is extremely portable, outputs magnetic field data instantly giving the user the ability to study magnetic phenomenon as they exist in the real world. Also, it can produce a recording, recording means could be added so that it would record the images that are captured by the camera.

BRIEF DESCRIPTION

The Real-Time Magnetic Field Camera invention includes; magnetic sensors that are triangulated, at least one microcontroller and/or microprocessor, has a means of an image display and a method of powering the device.

BRIEF DESCRIPTION OF THE DRAWINGS

The novel features of this invention, as well as the invention itself, will be better understood from the accompanying description taken in connection with the accompanying drawings in which like reference characters refer to like parts and in which:

FIG. 3 is a perspective view of the input module with the triangulated linear sensor plane depicted along with the principals of triangulation.

FIG. 4 is a perspective view of an individual printed circuit board and a perspective view of assembled input module both depicting the triangulated linear sensor planes.

FIG. 6 is a specific electrical schematic for the front sensor-pixel circuit as well as the specific microcontroller used in this embodiment.

FIG. 8 is a chart including the location of sensor outputs, shown as black squares, on the display module and mathematic principals that average between each sensor-pixel.

DETAILED DESCRIPTION OF THE INVENTION

Figure 1:
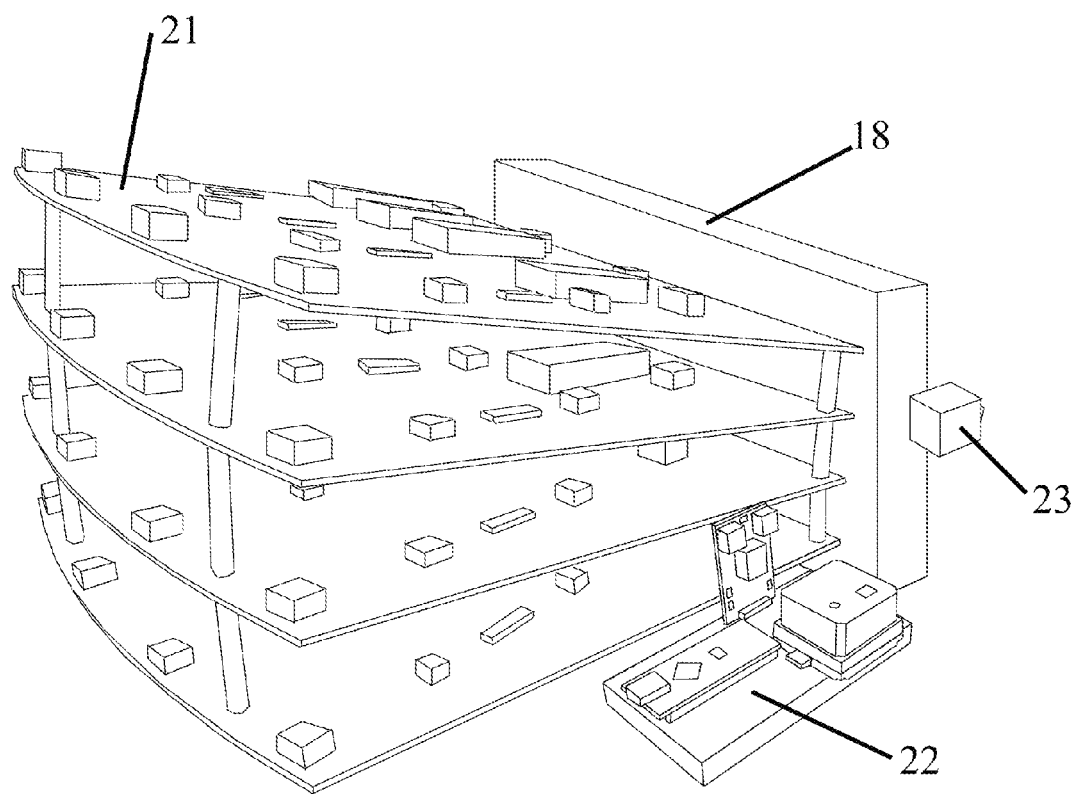
FIG. 1 is a perspective view of an embodiment of a Real-Time Magnetic Field Camera of the present invention.
Figure 2:
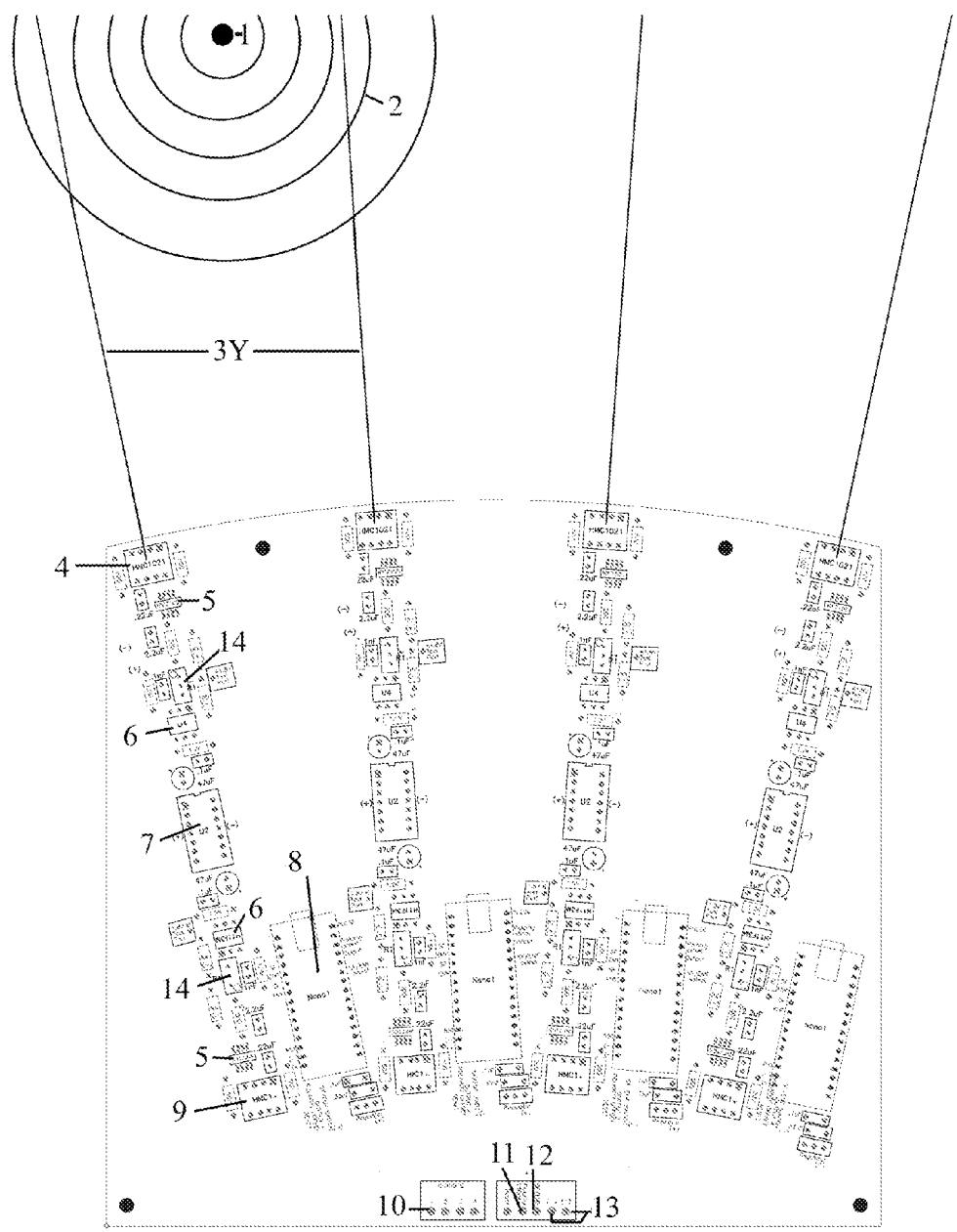
FIG. 2 is a top plan view of an individual printed circuit board with the triangulated linear sensor plane depicted.

The Real-Time Magnetic field camera is comprised of five sections; the input module 21, the output module 18, the tilt/gyro module 22, the static field/EMF mode selector switch 23 and a means to power the unit.

The input module 21 is comprised of necessary and optional components. The most basic embodiment of the input module 21 would only include magnetic sensors 4 that are triangulated and at least one microcontroller 8 or microprocessor 21. The operational amplifiers 7, balancing potentiometers 14, photo FET optocouplers 6, frequency filters 15 & 16, power MOSFET 5 degaussing features and rear magnetic sensors 9 are optional but are extremely valuable in creating a more useful and understandable image for the user.

A magnetic field 2 is the magnetic effect of electric currents as well as magnetic materials 1. The magnetic field 2 at any given point is specified by both a polarity and magnitude; as such it is a vector field. Magnetic sensors 4, such as magnetoresistive and hall-effect sensors, start from a quiescent voltage value and increase or decrease in voltage depending on the polarity and strength/distance of the magnetic fields present in a linear path. When a magnetic field is in front of the Real-Time Magnetic Field Camera the magnetic sensors 4 will increase in voltage if presented with a positive field or decrease if presented with a negative field.

In this embodiment, the magnetic sensor 4 array is triangulated 17 on both the horizontal 20$u$ and vertical plane 20$v$ at an angle 3Y or 3Z, having an optical center 19, in order to create an image plane 18. The triangulation creates a similar process to a light-based camera that utilizes curved glass lenses to achieve the triangulation necessary to convert a three-dimensional scene into a two-dimensional representation that is understandable to the user. In other embodiments, the triangulation can also be achieved by using straight sensors that use one or more magnetic sensors centered in the rear, as the optical center point 19 of the camera to achieve triangulation, being either scanning or continuous operation.

As the voltage increases or decreases away from the quiescent sensor state, the small voltage is amplified considerably using an operational amplifier 7. Increasing amplification will increase the range of the sensors. The amplified sensor signal goes through a low-pass frequency filter 15 then goes to one input on the microcontroller while simultaneously; the amplified sensor also goes through a high-pass frequency filter 16 and then enters an input on the microcontroller. After being filtered the voltage enters two inputs on the microcontroller 8 in the form of analog signals. Analog to digital converters, or ADCs, onboard the microcontroller unit, change the analog signal into binary code that the programmable microcontroller(s) require to process the inputs. This high-pass 16 and low-pass 15 filter processes enables the camera operator to select between static fields or oscillating electromagnetic fields, EMF, as the type of magnetic fields they want to observe. The camera operator can flip one selector switch 23 on the camera to select between EMF and static field modes.

The microcontroller 8 performs many important tasks such as, upon camera start up, a magnetic sensor degaussing process and a magnetic sensor calibration process. During operation, the microcontroller selects what inputs to read from, static or EMF mode, performs logical functions to reduce the effect of earths gravity and magnetic north and south poles on the camera utilizing the tilt/gyro module 22, other logical functions to reduce or eliminate magnetic field influences from behind the camera, and to output 10 a single analog voltage to the output module 18.

For this embodiment of the Real-Time Magnetic Field Camera, we are using magnetoresistive sensors 4 selected for having a stable quiescent voltage and a degaussing, set/reset feature. Magnetoresistive sensors are more stable than hall-effect sensors but can become polarized if the sensor comes in contact with a high magnitude magnetic field. For this reason a degaussing feature is advisable when selecting magnetoresistive sensors. Upon startup, a power MOSFET chip 5 is sent a series of microsecond pulses from the microcontroller 8, the power MOSFET chip 5 along with capacitors send a positive current spike, followed by a negative current spike in order to degauss, or set/reset, the magnetic sensors 4. A potentiometer 14 is used during initial calibration of the magnetic sensors 4 following the degaussing process. The potentiometer 14 balances the amplified signal from the magnetic sensor to about halfway between zero voltage and the supply voltage. In this embodiment, the supply voltage is 5 VDC, so the sensor will be balanced to around 2.5 VDC.

In this embodiment, there is a photo FET optocoupler 6 that acts as a remotely controlled resistor. This remotely controlled resistor is incorporated into the sensor balancing circuitry as it enters the operational amplifier 7. This photo FET optocoupler 6 can skew the polarity either positively or negatively without sacrificing sensor range. The photo FET optocoupler 6 is controlled by an output from the microcontroller 8. The microcontroller 8 receives a single analog input signal from a separate tilt/gyro sensor module 22. The microcontroller then outputs a voltage to the photo FET optocouplers 6 in order to counteract the effects of Earths gravity and magnetic poles.

In this embodiment of the Real-Time Magnetic Field Camera, other magnetic sensors 9 in the rear of the camera output voltages to two inputs on the microcontroller 8 following low-pass and high-pass frequency filters just like the magnetic sensors 4 in the front. The purpose of these rear sensors 9 is to reduce or eliminate the processing of dominant magnetic fields from behind the camera in order to see only magnetic fields originating from in front of the camera. This results in a more understandable image for the user. The microcontroller 8 uses programmed logic formulas to achieve this improved image. The formula states that if; the front magnetic sensor 4 is seeing a positive field sending voltage above the quiescent level and is greater than the voltage from the rear sensor 9 then the microcontroller 8 will pass the signal. Also, if the front magnetic sensor 4 is seeing a negative field, voltage below quiescent voltage, and is less than the rear sensor 9 voltage then the microcontroller will 8 will pass the signal. But if the magnetic sensor 4 signal is above the quiescent sensor level but the rear sensor 9 is higher, the microcontroller will not pass the signal. Likewise, if the magnetic sensor 4 is below the quiescent level and the rear sensor 9 is lower than the front magnetic sensor 4 then the microcontroller 8 will not pass the signal. Magnetic shielding has been tried, unsuccessfully, to reduce or eliminate the processing of dominant magnetic fields from behind the camera in order to see only magnetic fields originating only from in front of the camera. If magnetic shielding technology improves perhaps an embodiment of this Real-Time Magnetic Field Camera would use magnetic shielding in place of magnetic sensors 9 positioned in the rear of the camera.

Figure 5:
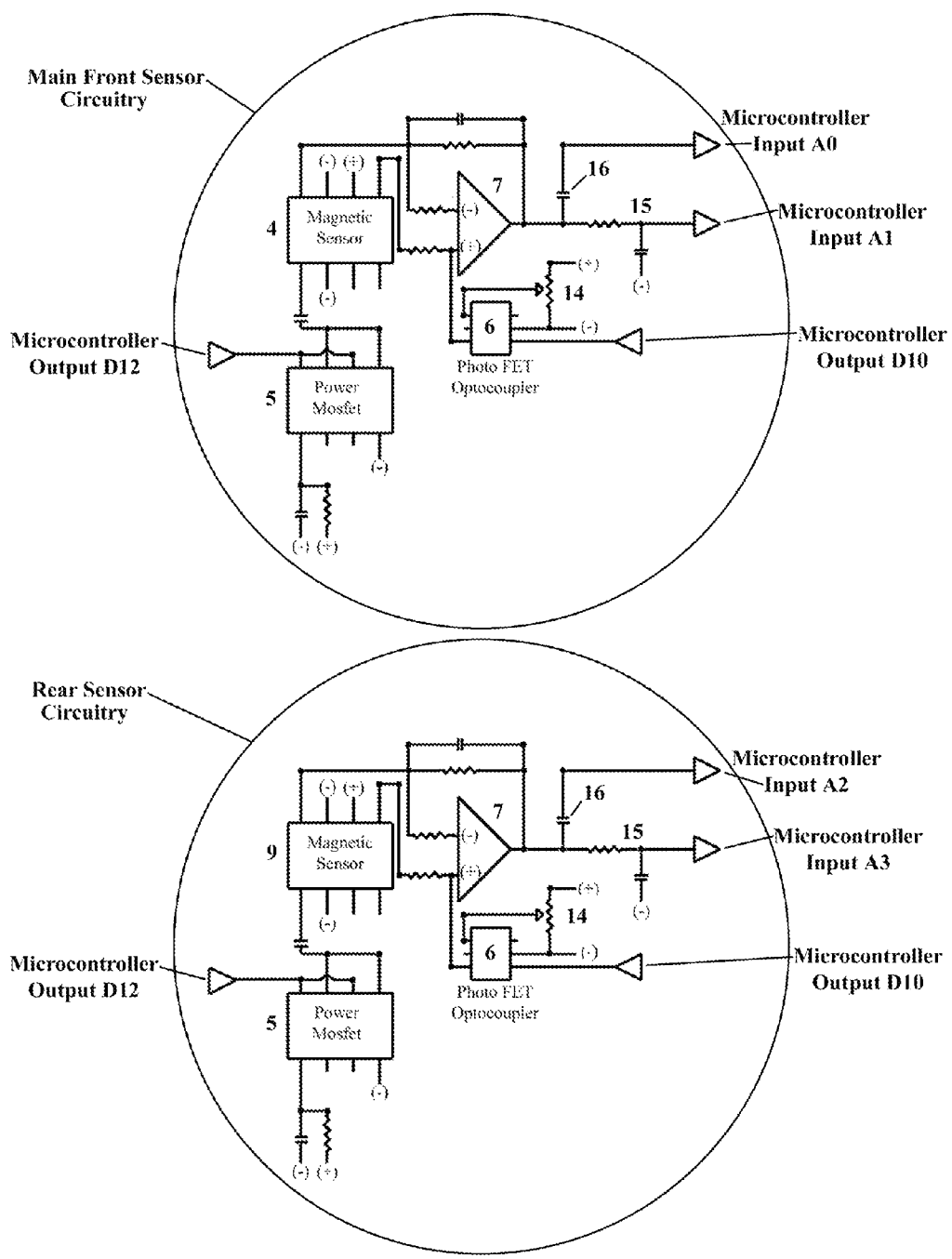
FIG. 5 is a general electrical schematic for the front sensor-pixel circuit as well as the rear sensor circuitry.
Figure 7:
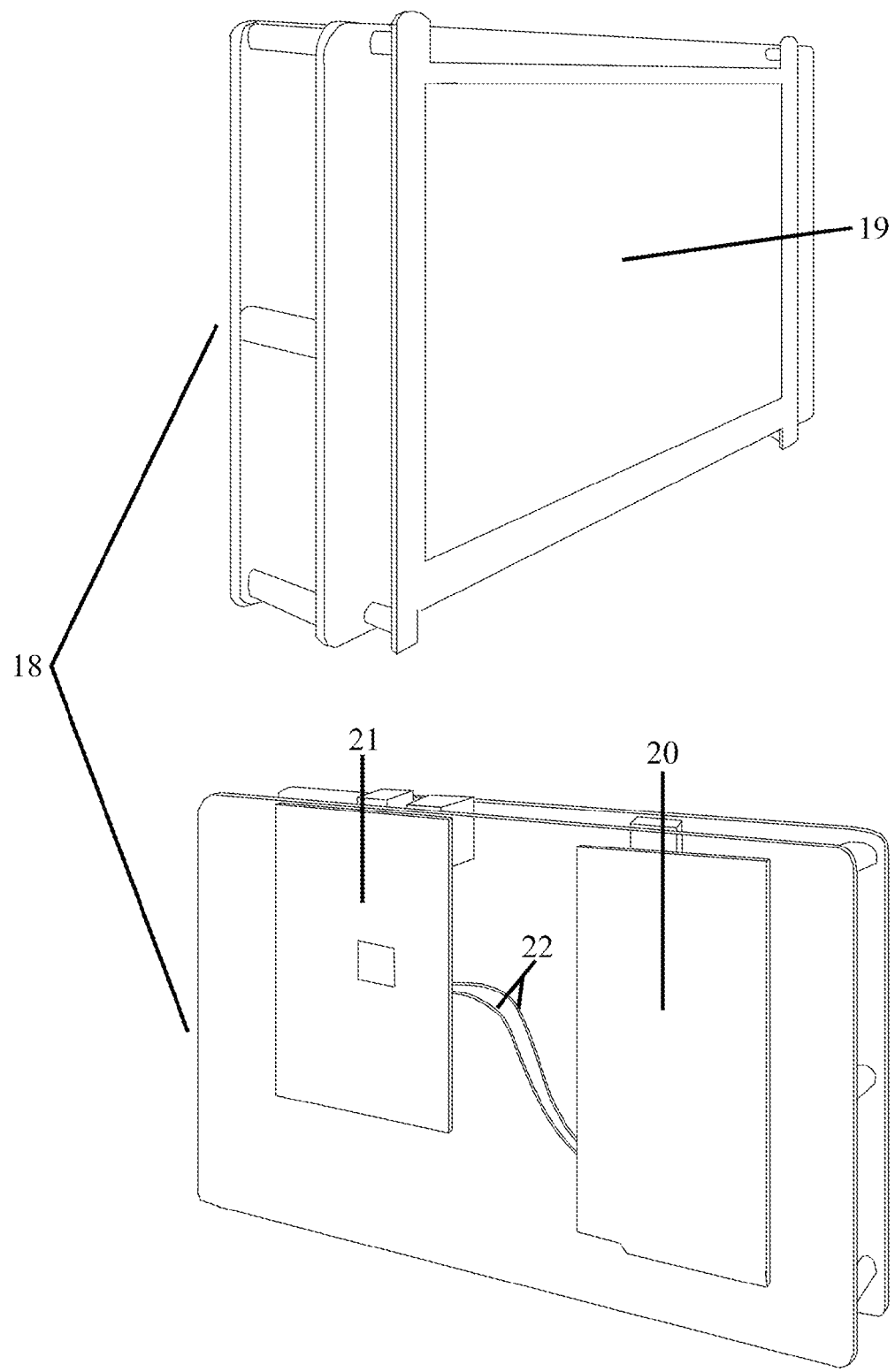
FIG. 7 is a perspective rear and front view of the output module for this embodiment.
Figure 9:
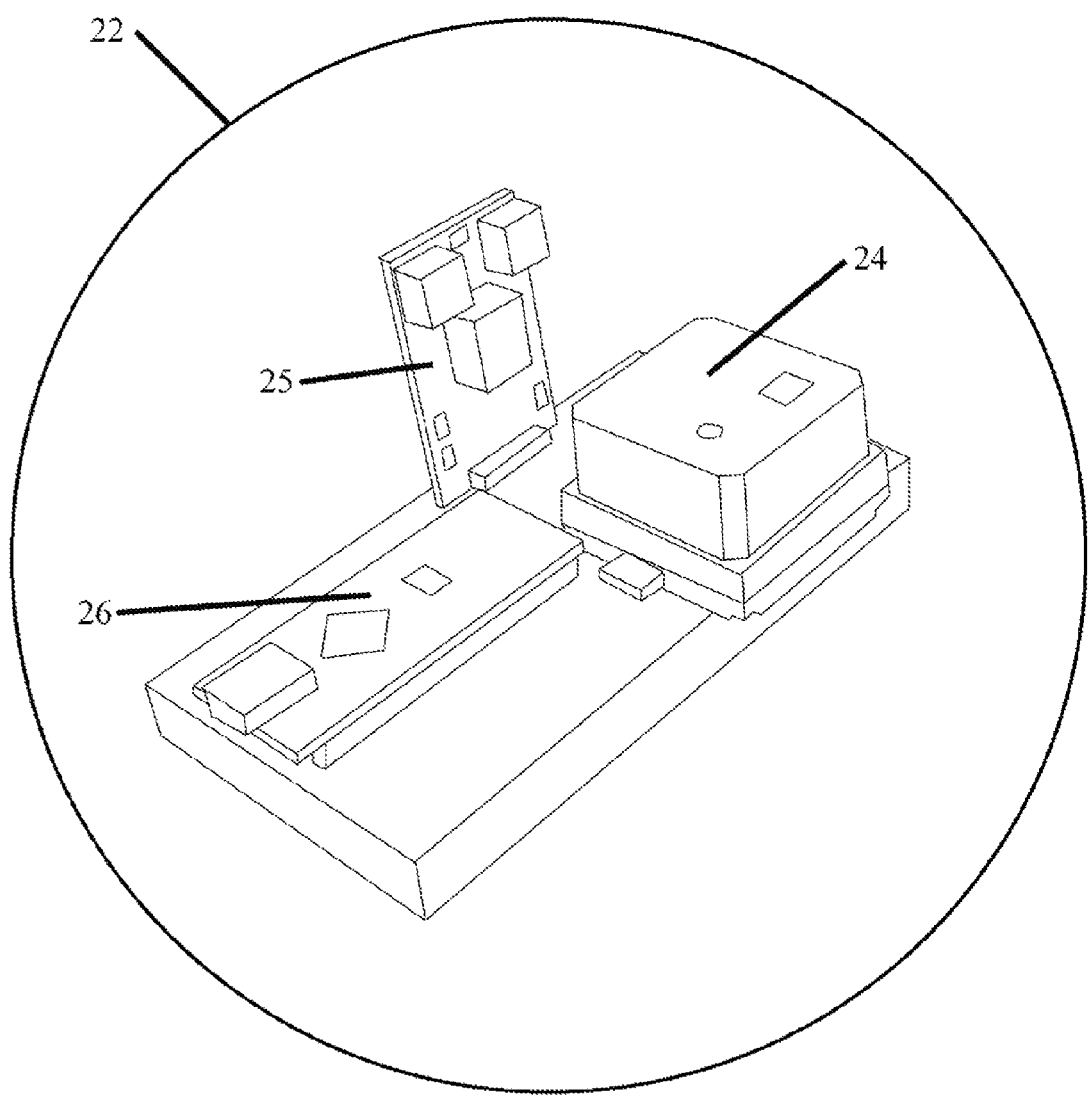
FIG. 9 is a perspective view of the tilt/gyro module.

All these inputs, processes and logical formulas result in a single analog output 10 from the microcontroller 8 to the output microcontroller 20 on the output module 18. This whole chain of electronics FIG. 5 & FIG. 6 is considered one sensor-pixel. This embodiment of the invention contains a total of 16 sensor-pixels. Increasing the amount of sensor-pixels, within a Real-Time Magnetic Field Camera, results in a higher resolution image displayed on the output device. All the Sensor-pixels are considered a sensor array.

The output module 18 can be an LCD screen or an LED matrix display. In this embodiment, the output module 18 is comprised of an LCD screen 19, a microprocessor 21 and an output microcontroller 20. The output microcontroller 20 receives voltages from the input module 21. In this embodiment the output microcontroller 20 has sixteen analog inputs for each of the sixteen sensor-pixels. The output microcontroller 20 communicates with the microprocessor by way of an I²C communication bus 22. I²C (Inter-Integrated Circuit) is a multi-master, multi-slave, single-ended, serial computer bus. It is typically used for attaching peripheral integrated circuits to processors and microcontrollers. The microprocessor is a small computer with an operating system and a graphics processor. The microprocessor is programmed to see all the inputs coming into the output microcontroller 20. In this embodiment of the camera, the microprocessor program performs math equations FIG. 8 in order to create a more defined and understandable image. The graphics program on the microprocessor averages between each triangulated magnetic sensor 4 to produce more pixels that are controlled by the magnetic sensor array. The microprocessor program changes the color of the pixels based on the polarity and magnitude of the magnetic sensors 4. At a quiescent voltage level, the pixel is black, if the voltage goes above the quiescent level the pixel fades to green, as the positive voltage magnitude increases it fades from green to blue, blue to purple and then purple to white. If the magnetic sensor 4 voltage goes below the quiescent state, the pixel fades from black to red, as the negative magnetic magnitude increases the pixel fades from red to orange, from orange to yellow and then yellow to white. This means that the input voltage level from a Sensor-pixel directly determines the color of the corresponding pixel on the screen. This color fade scheme is just for this embodiment of the Real-Time Magnetic Field Camera. Other versions may use an alternative color fade scheme.

Since the camera detects Earths gravity and magnetic poles, the Gyro/Tilt Module 22 is used to reduce or eliminate these effects without sacrificing magnetic sensor 4 sensitivity levels and range.

The gyro/tilt module is utilized for the purpose of making the Real-Time Magnetic Field Camera portable and able to pan, horizontally and vertically, without being effected by Earths gravity and magnetic poles. The gyro/tilt module 22 is comprised of an electronic gyro unit, an analog tilt unit and a microcontroller to process the signals and utilize mathematic formulas to produce a single analog voltage output. This analog voltage output is sent to all of the microcontrollers and then finally, to the photo FET optocouplers 6. This voltage can shift the polarity of each sensor-pixel, offsetting the effects of Earths gravity and magnetic poles. Vibration gyro sensors 24 sense angular velocity from the Coriolis force applied to a vibrating element inside the gyro unit 24. It uses a ratio of velocity and time to determine an approximate degree of rotation. Upon start up of the camera, the camera will be placed on a level surface and pointed west. Once the camera is turned on, it goes through a degaussing and calibration process that takes 10 seconds. At this point the gyro sensor 24 is set at 0°. As the user rotates north, the voltage applied to the photo FET optocouplers 6 will decrease in order to null out the effects of the north pole at 90°. If the user continues to rotate past north, the voltage to the photo FET optocouplers 6 will then decrease as it approaches east at 180°. Continuing clockwise past east, the voltage to the photo FET optocouplers 6 will increase approaching south, 270°. Rotating past south, the voltage to the photo FET optocouplers 6 will decrease until the camera is pointed back to 0°. The opposite will happen if the camera is rotated counterclockwise. The tilt sensor 25 sends an analog voltage to the tilt/gyro microcontroller 26. The voltage gradually increases as the camera is pointed downward and gradually decreases as the camera is pointed upward. This voltage from the tilt sensor 25 is used together with the gyro sensor 24 voltage to produce a single voltage output from the tilt/gyro microcontroller 26. This tilt/gyro microcontroller 26 voltage is what is sent to all of the microcontrollers 8 on the input module 21. After this voltage is received by the microcontrollers 8, the microcontrollers 8 output a voltage to the photo FET optocouplers 6. This process will allow the camera user to rotate 360° and pan the camera up and down without, or with reduced, interference from Earths gravity and magnetic fields.

Static field/EMF mode selector switch 23 is a single-pole, single-throw switch that sends 5 VDC or 0 VDC to all of the microcontrollers 8 on the input module 21, digital input D7. If the user desires to see static fields the static field/EMF mode selector switch 23 would be in the position to send 0 VDC to the microcontrollers 8. If the user desires to see EMF, or oscillating magnetic fields, the switch 23 would be in the position to send 5 VDC to the microcontrollers 8. This voltage, or lack of voltage, is used by the microcontrollers 8 to determine what input to use. EMF mode will select the high-pass filtered input, while static field mode will select the low-pass filtered input.

This embodiment is assembled by stacking 4 of the printed circuit boards with longer mounting spacer hardware in the front and shorter mounting spacer hardware in the rear. This is done in order to triangulate the sensors on the vertical axis 3Z. Each circuit board is designed to triangulate the sensors on the horizontal axis 3Y.

All of the modules would be placed inside of a nonmagnetic or nonmagnetic-reactive housing to protect the electronics from moisture and other damage. Such housing could be made of plastic, acrylic, copper or aluminum.

The Real-Time Magnetic Field Camera will need to have a power source, an onboard battery, a separate battery pack or an AC to DC power supply. This embodiment uses a separate battery pack that the user would wear on their back like a backpack. This reduces the camera weight, making the camera easier to operate. The battery output of this embodiment outputs 5 VDC at 10 A.

What is claimed is:

1. A Real-Time Magnetic Field Camera comprising: an array of magnetic detection elements, with each said detection elements adapted for producing an output signal representative of the relative magnitude and polarity of magnetic energy applied thereto; means for sensing a field of view in a linear path; and means for processing the output signals from each of said detection elements to cause the signals from each of the elements as to provide a resultant output signal indicative of the relative magnetic energy distribution within said field of view.

2. The system of claim 1 wherein said array is a linear array of detection elements oriented utilizing triangulation principals to attain an image plane.

3. The system of claim 1 wherein said magnetic detection element output signals may be amplified to improve range and sensitivity.

4. The system of claim 1 wherein said means for processing includes means for reducing the effects of Earths gravity and magnetic poles as well as means for reducing the effects of magnetic fields originating from behind the system of claim 1.

5. The system of claim 1 wherein said detection elements include, but are not limited to, magnetoresistive sensors or hall-effect sensors, either individual elements or multiple elements combined into a single element and may include additional electrical circuitry to improve the characteristics of said detection elements.

6. The system of claim 1 wherein said means for processing include, but are not limited to, one or more microcontrollers and/or one or more microprocessors.

7. The system of claim 1 further comprising a display device synchronized to said output signal(s), displaying a varying color scheme based on the polarity and magnitude of the output signal(s).

8. The system of claim 7 wherein said display device, based on the polarity and magnitude of said output signal(s), depict representations of the corresponding sensors in their approximate horizontal and vertical locations.

9. The system of claim 7 wherein said display device displays said output signal(s) relatively instantaneous.

* * * * *